United States Patent [19]

Eckart et al.

[11] 4,245,318

[45] Jan. 13, 1981

[54] CIRCUIT BREAKER DEMONSTRATOR AND DISTRIBUTION CIRCUIT PROTECTION COORDINATOR APPARATUS

[75] Inventors: Gregory C. Eckart, Southington; Lewis W. Jacobs, Simsbury; Morris J. Kornblit, Newington, all of Conn.

[73] Assignee: General Electric Company, New York, N.Y.

[21] Appl. No.: 36,936

[22] Filed: May 7, 1979

[51] Int. Cl.³ .............................................. G06G 7/62
[52] U.S. Cl. .................................. 364/481; 340/734; 361/63; 364/802; 364/857
[58] Field of Search ............... 364/481, 492, 578, 800, 364/801, 802, 807, 851, 857; 340/650, 653, 734; 361/5, 28, 31, 36, 57, 63, 74, 94–97

[56] References Cited

U.S. PATENT DOCUMENTS

| | | | |
|---|---|---|---|
| 3,444,434 | 5/1969 | Zocholl | 361/97 |
| 3,537,096 | 10/1970 | Hatfield | 340/734 |
| 3,944,890 | 3/1976 | Little | 361/96 |
| 4,017,766 | 4/1977 | Vercellotti et al. | 361/96 |
| 4,036,553 | 7/1977 | Borel et al. | 340/752 |

*Primary Examiner*—Errol A. Krass
*Attorney, Agent, or Firm*—Robert A. Cahill; Walter C. Bernkopf; Philip L. Schlamp

[57] ABSTRACT

Demonstrator apparatus utilizes a display to portray in log-log coordinate scale the trip-time curve of a solid state (static) trip circuit breaker. A simulated static trip unit programmer is selectively adjustable to vary the shape and position of the displayed trip-time curve. An overlay bearing the trip time-current curve for a prospective upstream or downstream circuit protective device is superimposed on the display and the programmer adjusted to demonstrate selective trip coordination. Alternatively, a pair of simulated trip unit programmers are connected to the display to jointly portray thereon a pair of trip-time curves. Also disclosed is the utilization of a computer to generate on a display plural time-current response curves of a series of circuit protective devices selected on the basis of specific distribution system parameters to provide requisite system protection and response coordination.

9 Claims, 6 Drawing Figures

FIG. 3
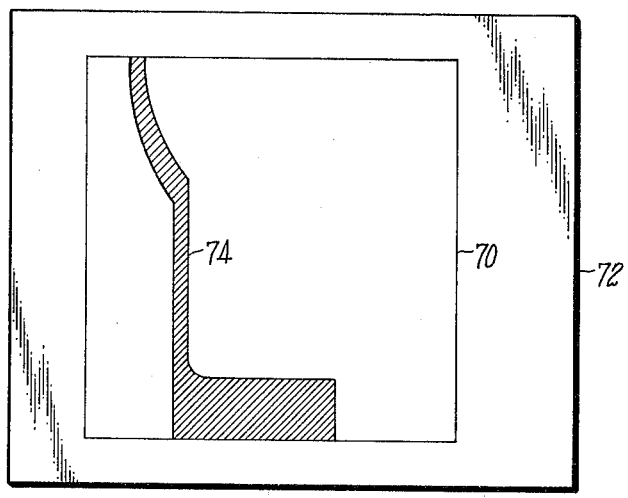
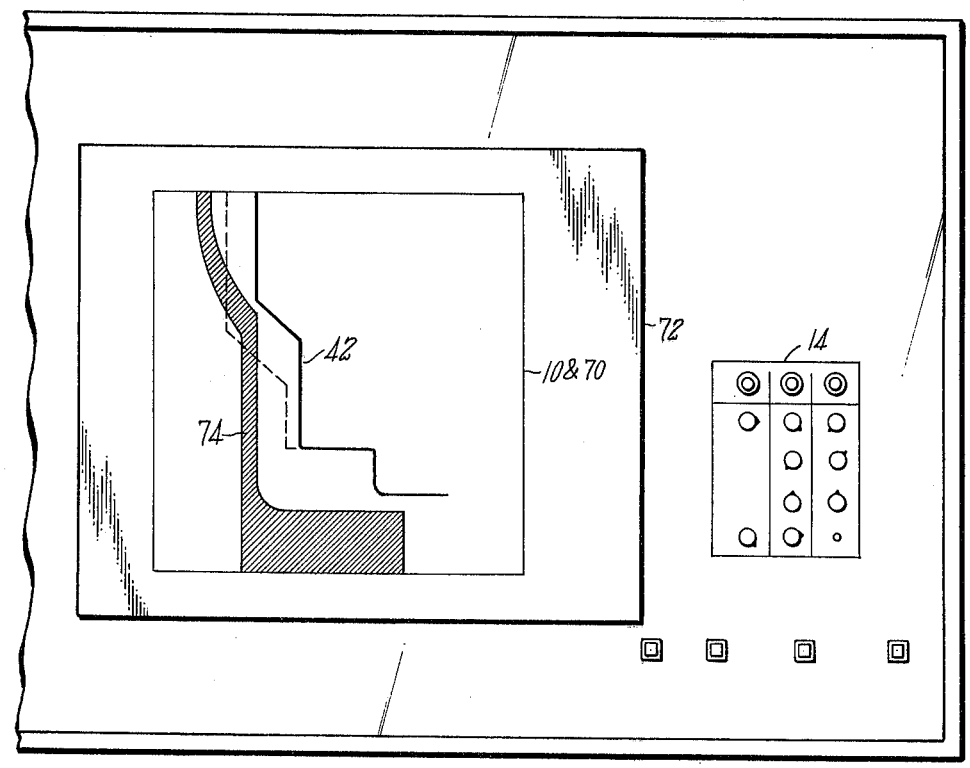
FIG. 4

CIRCUIT BREAKER DEMONSTRATOR AND DISTRIBUTION CIRCUIT PROTECTION COORDINATOR APPARATUS

BACKGROUND OF THE INVENTION

Manufacturers of circuit protective devices, e.g., circuit breakers fuses, overload relays, etc., provide log-log coordinate graphs of the response time versus current curves for their devices. In the case of a circuit breaker, for example, its response time versus current curve, typically referred to as a trip-time curve, indicates the time in which the breaker will trip in response to a particular level of overcurrent. Thus, if the overcurrent is of sustained overload proportions, the circuit breaker's trip-time curve shows that it will trip within a prescribed time determined by the overcurrent magnitude. Overload tripping is typically performed on an inverse-time basis, i.e., the larger the overload current, the less time to trip, and vice versa. Circuit breakers are designed to trip on this basis so as not to trip in response to normal, momentary overload currents which flow, for example, during motor starting. Overload current responses of fuses and overload relays are also predicated on an inverse-time basis. Circuit protective devices, including circuit breakers, are also designed to respond to overcurrents of short circuit proportions, e.g., ten times rated current, on an instantaneous basis, that is, without intentional delay. A typical circuit breaker clearing time, i.e., the maximum time taken by the breaker to physically open its contacts and interrupt short circuit currents, is typically twenty-five to thirty milliseconds.

Intermediate the overload and short circuit overcurrent ranges is a heavy overload current range, e.g. three to ten times rated current, which is typically handled on a fixed time delay basis. That is, circuit interruption in response to heavy overload current levels is effected upon the expiration of a predetermined fixed short time delay.

Once an electrical power distribution system has been designed, its loads and operating conditions defined, and the voltages and electrical equipment selected, it remains to determine the appropriate circuit protective devices to be used. The primary concern in this determination is protection of the distribution system in the event of a fault precipitating abnormal overcurrent condition, i.e., to prevent or at least minimize damage to the system, including its conductors and connected loads. Such a fault may be caused by equipment failure, human error, or emergencies of natural origin. Typically, such faults are unpredictable, and thus the selected circuit protective devices must function automatically to fully protect the system, and incidentally to protect personnel and property against the consequential hazzards of such faults.

Another principal concern associated with the determination of the circuit protective devices to be used is to minimize the extent and duration of electrical service interruption in the event of a fault. In all but the simplest systems, there are two or more circuit protective devices between a fault and the source of the fault current. In order to minimize electrical service interruption, these protective devices should be selective in response such that the one nearest the fault will first attempt to interrupt the fault current. If, for any reason, this protective device does not clear the fault in timely fashion, the next upstream protective device will attempt to do so, and so on. This response selectivity is termed system selective coordination. To achieve such coordination the protective devices must be chosen on the basis of their particular response time-current characteristics so as to operate on the minimum current that will enable them to distinguish between fault currents and permissible, short term load currents in excess of rated current. Each device should operate in the minimum time possible and yet be selective, i.e., coordinate, with other devices in series therewith. When these two requirements are met, damage to the system and service interruption are minimized.

It is thus appreciated that the concerns of adequate distribution system protection and coordination involved in the selection of the appropriate circuit protective devices to be implemented requires a complete understanding of the response time-current curves of the numerous types and kinds of circuit protective devices available. For it is on the basis of these curves that the circuit protective device selections are made pursuant to achieving requisite system protection and coordination on the most economically practical basis.

In performing a circuit protective device system coordination study, data relevant to the distribution system in which the devices are to be implemented is documented. This data includes the impedance values of the loads and distribution equipment, the maximum and minimum short circuit currents available at all pertinent points in the system, and the equipment operating and protection rating boundaries. In terms of equipment boundaries, the maximum load currents together with the maximum available short circuit currents determine the upper and lower boundaries of current response within which the circuit protective devices must operate. That is, the protective devices must be selected such as not to respond to full load current, permissible overcurrents and starting or inrush currents. Also to be considered is the time withstand of the equipment to currents of overcurrent proportions. In the case of electrical motors, for example, withstand current is defined in terms of maximum allowable stall time, which is the time the motor can be subjected to stalled rotor current magnitudes before damage ensues.

The next step involves plotting a current versus time profile representing the operating and protection boundary of each equipment load on translucent log-log coordinate graph paper. Using a light box, this graph paper is overlaid with the response time-current curves printed also on translucent log-log coordinate graph paper of various circuit protective devices pursuant to determining which of these devices has a response curve lying most closely to the right of the equipment profile curve without overlapping same, and yet has the capacity to interrupt the available downstream short circuit current. The response curve of the protective device meeting these requirements is then traced on the graph paper. This process is repeated to identify the next upstream protective device whose response curve lies most closely to the right of the device response curve previously traced, and so on until the utility source is reached. As long as overlap between response curves is avoided, full selective coordination between circuit protective devices is achieved. Occasionally, it becomes impossible or impractical in terms of device cost to completely avoid overlapping, and thus something less than full selective coordination results. In these instances, a thorough engineering analysis weighing the oppositely working goals of maximum system protection and full selective coordination, i.e., absolute minimum electrical service interruptions, can provide a satisfactory compromise.

It is accordingly an object of the present invention to provide demonstrator apparatus capable of serving as an educational tool in promoting an understanding of the response time versus current characteristics of circuit protective devices.

A further object is to provide demonstrator apparatus of the above character wherein the various adjustment capabilities of a static trip circuit breaker and the consequent effects on the shape and position of the circuit breaker trip-time curve are displayed.

Yet, another object is to provide demonstrator apparatus of the above-character having application in assisting in the conduction of circuit protective device system coordination studies.

Another object is to provide display apparatus for portraying plural system coordinated circuit protective device response time versus current curves, wherein the display apparatus is implemented with a computer operating to select the appropriate circuit protective devices capable of providing maximum system protection and coordination based on predetermined distribution system parameters.

Other objects of the invention will in part be obvious and in part appear hereinafter.

SUMMARY OF THE INVENTION

In accordance with the present invention, there is provided apparatus for displaying the time versus current response characteristics of a circuit protective device in a manner such as to demonstrate the circuit protective response of the device to various levels of overcurrent. More specifically, the apparatus includes a display divisioned in log-log coordinates and activated to portray a time versus current response curve of a circuit protective device, such as a static trip circuit breaker's trip-time curve. The display is activated from a simulated static trip unit programmer equipped with the various adjustment controls existing in a commercial circuit breaker static trip unit programmer. As is well understood in the art, these controls serve to adjust the shape and position of the breaker's trip-time curve to facilitate rather precise tailoring of the breaker's response characteristics to a particular load current profile. Thus, for example, the simulated programmer includes a long time current pickup control for setting, consistent with the breaker frame size, the minimum level of current on which the breaker will trip. Adjustment of this control varies the position of the upper, vertical portion of the trip-time curve portrayed on the display. A second simulated programmer control adjusts the display position of the long time delay portion of the trip-time curve to visually portray the duration of time the breaker will delay its tripping response to a sustained overcurrent level in excess of the long time pickup current setting established by the first control.

A third simulated programmer control adjustably sets the position of the short time pickup current level portion of the breaker's trip-time curve portrayed on the display. This setting establishes a higher overcurrent level which, if exceeded, institutes a short time delay trip unit operating mode adjustably established by a fourth programmer control. Adjustment of this fourth control in the simulated programmer similarly varies the position of the short time delay portion of the displayed breaker trip-time curve.

A fifth control, establishing the instantaneous current pickup level, adjusts the position of the lower most portion of the displayed trip-time curve to portray a still higher level of overcurrent which, if exceeded, institutes an instantaneous trip unit operating mode. In practice, the instantaneous trip mode of the trip unit causes the breaker to be tripped open as abruptly as physically possible, i.e., without intentional delay.

The demonstrator apparatus of the invention preferrably also includes a second graphical display in log-log coordinates for portraying the trip-time curve of a static trip circuit breaker whose trip unit is equipped to respond to ground fault current. This second display is activated from the simulated programmer, specifically the ground fault current pickup level adjustment control and the ground fault delay adjustment control incorporated therein. Adjustments of these controls vary the position of the ground fault trip-time curve portrayed on the second display, thus to demonstrate the operation of a static trip circuit breaker in response to various levels of ground fault current.

As an additional feature of the present invention, the display is activated from two simulated trip unit programmers to simultaneously display a pair of breaker trip-time curves. The programmer controls are then adjusted to demonstrate how selective coordination can be achieved between upstream and downstream circuit breakers. In this respect, the apparatus of the invention has practical utility in performing selective coordination studies with respect to actual power distribution systems.

Alternatively, the time-current response curve of an upstream or downstream circuit protective device is printed in log-log coordinates on a transparent overlay which is superimposed on the display activated from one or more simulated programmers. The programmer controls are then adjusted to achieve selective coordination between the displayed trip-time curves and the overlay imprinted response curve.

Yet another aspect of the present invention involves utilizing a computer to generate a plurality of circuit protective device time-current response curves for portrayal on a graphical display divisioned in log-log coordinates. The computer is fed the pertinent data regarding a power distribution system for which maximum protection and selective coordination is to be afforded. The computer has access to a memory in which is stored data for the time-current response characteristics or curves, including adjustment capabilities, of all available circuit protective devices. Based on the system data fed to the computer, the computer selects the most appropriate protective devices, consistent with maximum system protection and selective coordination, and retrieves their response curves from memory for joint portrayal on the display. Curve overlapping can be readily, visually determined and evaluated, or automatically noted by the computer. It is seen, by virtue of this aspect of the present invention, that one can perform a system protection and selective coordination study in essentially automated fashion in less time and with greater precision than has heretofore been possible.

The invention accordingly comprises the features of construction and arrangements of parts which will be exemplified in the constructions hereinafter set forth, and the scope of the invention will be indicated in the claims.

For a better understanding of the nature and objects of the invention, reference should be had to the following detailed description taken in connection with the accompanying drawings, in which:

FIG. 3 is a perspective view of a transparent overlay bearing a circuit protective device time-current response curve printed on a log-log coordinate graph;

FIG. 4 is a front view of the demonstrator apparatus of FIG. 1 illustrating its utilization with the overlay of FIG. 3 to demonstrate system coordination;

Like reference numerals refer to corresponding parts throughout the several views of the drawings.

DETAILED DESCRIPTION

Figure 1:
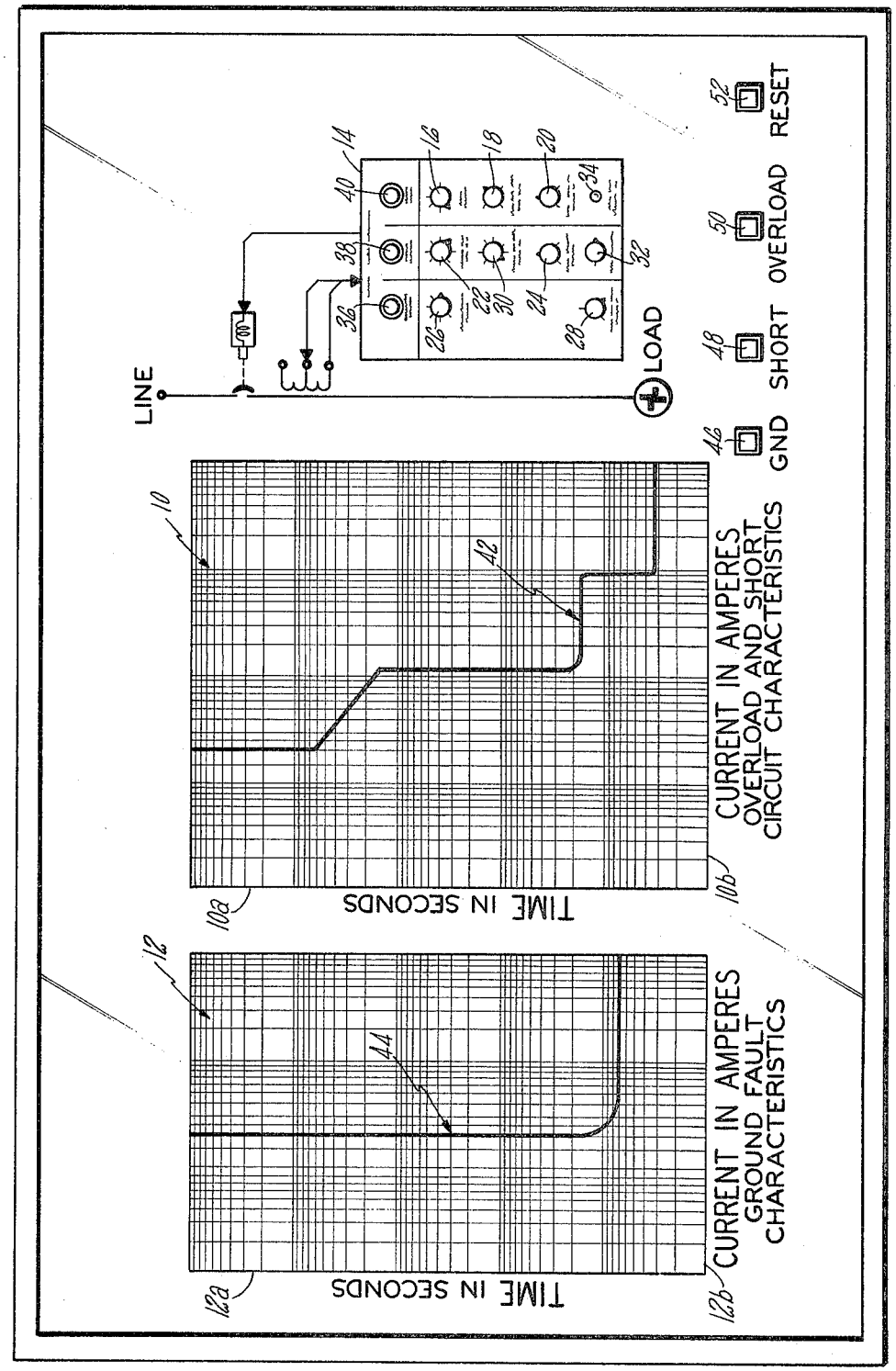
FIG. 1 is a front view of circuit protective device response demonstrator apparatus constructed in accordance with the present invention.

Referring now to the drawings, the demonstrator apparatus of the present invention is illustrated in FIG. 1 as including an overload and short circuit current characteristic display 10 and a ground fault current characteristic display 12. The face of display 10 is imprinted in graphical fashion with graduation lines in log-log scale in conjunction with a vertical time coordinate 10a and a horizontal current coordinate 10b. Similarly, the face of display 12 is imprinted with a vertical time coordinate 12a and a horizontal current coordinate 12b, both graduated in logarithmic scale fashion. These displays may be light emitting diode displays, liquid crystal displays, video tube displays, etc.

Also represented at front of the demonstrator is the simulated faceplate 14 of a static trip unit programmer, such as utilized in industrial circuit breakers marketed by the General Electric Company under the trademark "VersaTrip". As in the actual programmer, the simulated programmer faceplate has a plurality of control knobs protruding therethrough, simulating the various control knobs available in a commercial "VersaTrip" programmer. Accordingly, control knob 16 represents the ampere setting adjustment, control knob 18 represents the longtime pickup adjustment, knob 20 represents the long time delay adjustment, knob 22 represents the instantaneous pickup adjustment, knob 24 represents the short time delay adjustment, knob 26 represents the ground fault pickup adjustment, and knob 28 represents the ground fault delay adjustment; all available in the commercial static trip unit programmer. Additional adjustment capability may be provided by a short time pickup knob 30 and a knob 32 to switch in or out a short time delay inverse time function. A pilot light 34 may be included to indicate a long time delay operating mode in progress. The simulated programmer faceplate 14, again as in the commercial version, is provided with popout indicators 36, 38 and 40, which serve to indicate the operative tripping mode, i.e., ground fault, short circuit, or overload.

Also imprinted on the face of the demonstrator is a single line circuit diagram depicting the functional relationship of the simulated programmer to a circuit breaker and the circuit breaker to a load circuit.

Figure 2:
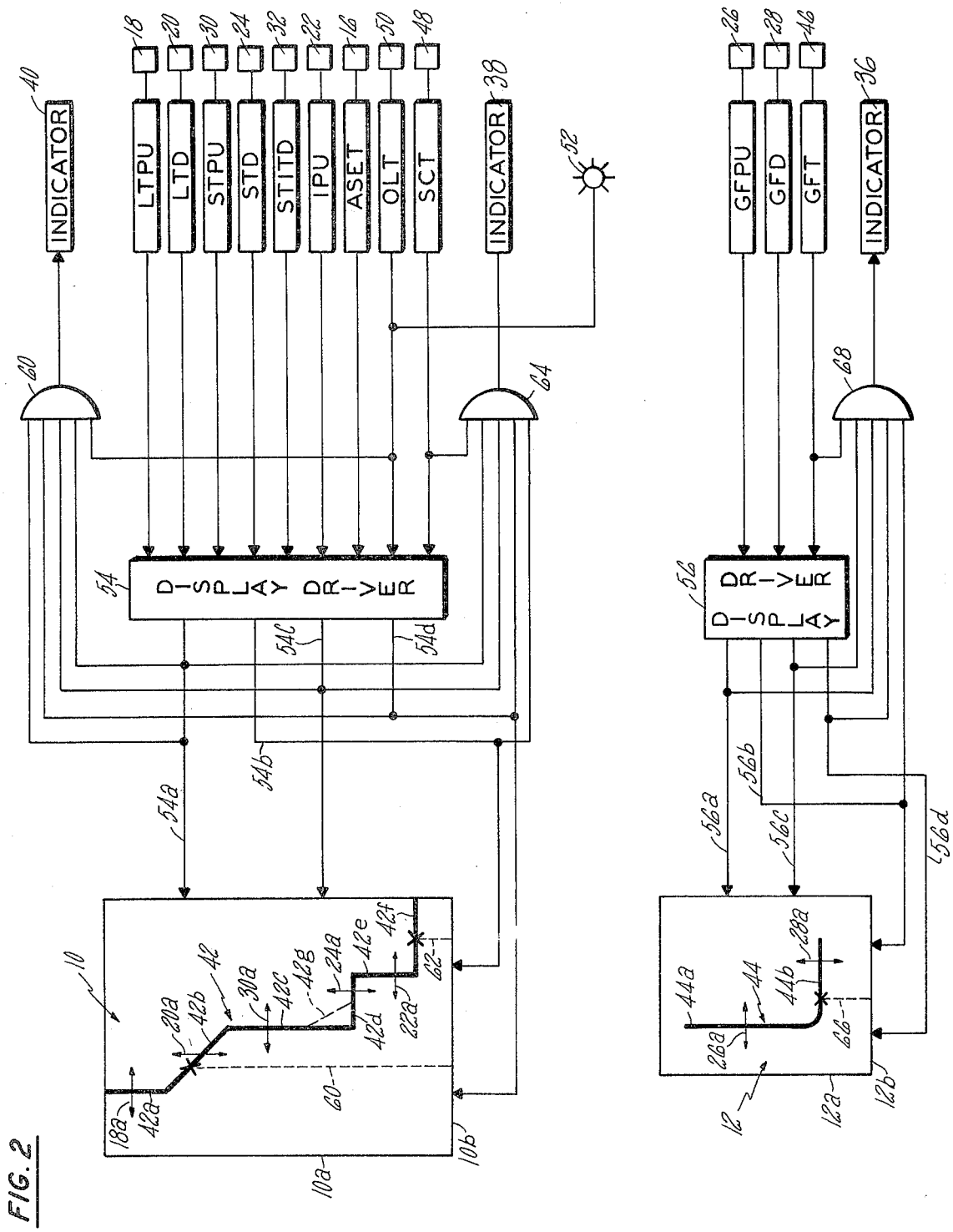
FIG. 2 is a schematic block diagram of the demonstrator apparatus of FIG. 1.

As will become apparent from FIG. 2, the various simulated programmer controls serve to generate a phase overcurrent trip-time curve 42 on display 10 and a ground fault current trip-time curve 44 on display 12. Adjustments of these controls serve to vary the shapes of the displayed trip-time curves and their positions relative to the time and current logarithmic coordinates. As seen in FIG. 1, the demonstrator includes a pushbutton 46 for initiating a simulated ground fault trip function, a pushbutton 48 for initiating a simulated short circuit trip function, a pushbutton 50 for initiating an overload trip function, and a pushbutton 52 for resetting the demonstrator upon completion of a simulated trip function.

Turning to FIG. 2, the various simulated programmer controls establishing the shape and position of trip-time 42 are connected to supply signals to a display driver 54, which in turn activates display 10 via connections 54a and 54b. Similarly, the various simulated programmer controls establishing the position of trip-time curve 44 are connected to supply signals to a display driver 56 for activating display 12 over connections 56a and 56b. The long time pickup control LTPU generates the upper most vertical portion 42a of trip-time curve 42, long time delay control LTD generates the next lower, sloping portion 42b of curve 42, short time pickup control STPU generates the next lower, vertical curve position 42c, short time delay STD generates the horizontal curve portion 42d, and instantaneous pickup control IPU generates the lower most vertical curve portion 42e and concluding horizontal curve portion 42f. Adjustment of long time pickup control LTPU via knob 18 in FIG. 1 moves the curve portion 42a horizontally to the right or left as indicated by arrow 18a. Knob 20 adjusts longtime delay control LTD to move curve portion 42b up or down, as indicated by arrow 20a, without changing its slope. Short time pickup control STPU, via adjustment knob 30, moves curve portion 42c left or right, as indicated by arrow 30a. Curve portion 42d is moved up or down, as indicated by arrow 24a, via adjustment of short time delay control STD via knob 24. Instantaneous pickup control IPU is adjusted via knob 22 to move curve portion 42e left or right, as indicated by arrow 22a. The vertical position of curve portion 42f is fixed and simply lengthens or shortens in concert with the positional adjustment of curve portion 42e.

Ampere setting control ASET supplies signals to display driver 54 and is adjusted via knob 16 of FIG. 1 to bodily move the display position of the entire trip-time curve 42 right or left without changing the curve shape established by the other controls. In addition, short time inverse time delay control STITD, when switched in by knob 32 of FIG. 1, inserts a sloping curve portion, indicated in dash line at 42g, intermediate curve portions 42c and 42d, in lieu of the sharp corner therebetween.

With regard to display 12, a ground fault pickup control GFPU is adjusted by knob 26 to move the vertical portion 44a of the displayed ground fault trip curve 44 right or left as indicated by arrow 26a, while a ground fault delay control GFD is adjusted by knob 28 to move the horizontal curve portion 44b up or down as indicated by arrow 28a.

An overload test control OLT, activated by pushbutton 50 in FIG. 1, and a short circuit test control SCT, activated by pushbutton 48, also supply signals to display driver 54 which, in turn, activates display 10 over connections 54c and 54d to respectively simulate overload and short circuit current conditions. Thus, activation of overload test control OLT causes display 10 to produce a vertical time trace, indicated by the dash line 60, which moves upwardly at a rate correlated with the time coordinate scale 10a from a point on current coordinate 10b, corresponding to a preselected overload current level. The eventual intersection of trace 60 with curve 42 is sensed by a coincidence gate 61 whose output then goes high to activate popout overload trip indicator 40. Activation of overload test control OLT also produces energization of pilot light 52, signalling that a simulated overload trip function is in progress. The overload test control may be made adjustable to select various simulated levels of overload current, thus to demonstrate the inverse time response of commercial static trip circuit breakers to overload currents.

Similarly, depression of pushbutton 48 activates short circuit test control SCT, and a time trace, dash line 62 in FIG. 2, is generated on display 10 emanating from a point on current coordinate 10b corresponding to a current level of short circuit proportions. Intersection of this trace with trip-time curve 42, which occurs virtually instantaneously with the depression of pushbutton 48, is detected by coincidence gate 64, and its output goes high to activate pop-up indicator 38.

Depression of pushbutton 46 activates a ground fault test control GFT to generate signals to display driver 56; the latter then acting via connections 56c and 56d to generate a time trace 66 on display 12 emanating from current coordinate 12b at a point corresponding to a preselected level of ground fault current. Intersection of this time trace with the displayed trip-time curve 44 qualifies coincidence gate 68 to activate popout ground fault trip indicator 36, simulating the completion of a ground fault trip function by a commercial static trip circuit breaker.

From the description thus far, it is seen that the demonstrator apparatus of the present invention provides a valuable educational and promotional tool for demonstrating to potential users the circuit protection capabilities of modern static trip industrial circuit breakers and particularly the wide range of adjustability of the time-current response characteristics of such circuit breakers.

To demonstrate the ease in which a static trip circuit breaker can be coordinated with a downstream circuit protective device, a log-log coordinate graph of the time-current response curve of a representative downstream protective device is printed on a transparent overlay which is then registered in superimposed relation with demonstrator display 10. Thus, as seen in FIG. 3, a log-log coordinate graph 70 is printed on a transparent overlay 72. Printed on this graph is the time-current response curve of a circuit protective device, such as the trip-time curve 74 of a General Electric TFJ molded case, thermal-magnetic trip circuit breaker frequently utilized downstream of a static trip current breaker equipped with the trip unit programmer simulated in the demonstrator apparatus. The overlay graph 70 is appropriately registered with the printed log-log coordinate graph associated with display 10 to present trip-time curves 42 and 74 in associated relation, as seen in FIG. 4. It can then be readily observed that if curve 42 portrayed on display 10 is in its dash line position, overlap with curve 74 exists, and thus the two simulated circuit breakers would not be in selective trip coordination. That is, for an overload current level vertically aligned with the curve overlapping region, the upstream static trip breaker can trip before or coincidentally with the downstream breaker, an undesirable situation in terms of holding service interruptions to a minimum. The simulated trip unit programmer controls can then be adjusted to reshape and reposition curve 42 to its solid line position in FIG. 4, thus avoiding any overlap with curve 74.

It is then seen that, for all overcurrent levels, the downstream circuit breaker should trip before the upstream static trip circuit breaker, and selective trip coordination between these two circuit breakers is therefore achieved. It will be appreciated that the overlay time-current response curve may be that of a representative circuit protective device utilized upstream of the static trip circuit breaker simulated by the demonstrator. Curve 42 is then adjusted to eliminate overlap with the upstream device curve, thereby providing selective trip coordination therebetween in that, again, the downstream breaker should always trip before the upstream device can trip in response to all levels of overcurrent. It will also be appreciated that two or more response curve overlays may be registered with display 10 to demonstrate selective trip coordination between three or more serially connected circuit protective devices. Moreover, it will readily occur to those skilled in the art that the demonstrator may be utilized in conjunction with time-current response curve overlays in performing an actual selective coordination study pursuant to determining the appropriate circuit protective devices and the settings thereof, if adjustable, for installation in a proposed power distribution system.

While the foregoing description dealt with the use of response curve overlays in conjunction with the phase overcurrent trip-time curve 42 portrayed on display 10, it will be understood that ground fault current response curve overlays may be utilized in conjunction with ground fault trip-time curve 44 (FIGS. 1 and 2) portrayed by display 12 pursuant to both demonstrating and determining ground fault selective trip coordination between upstream and downstream ground fault trip circuit breakers, also a prerequisite to achieving minimum service interruption.

Figure 5:
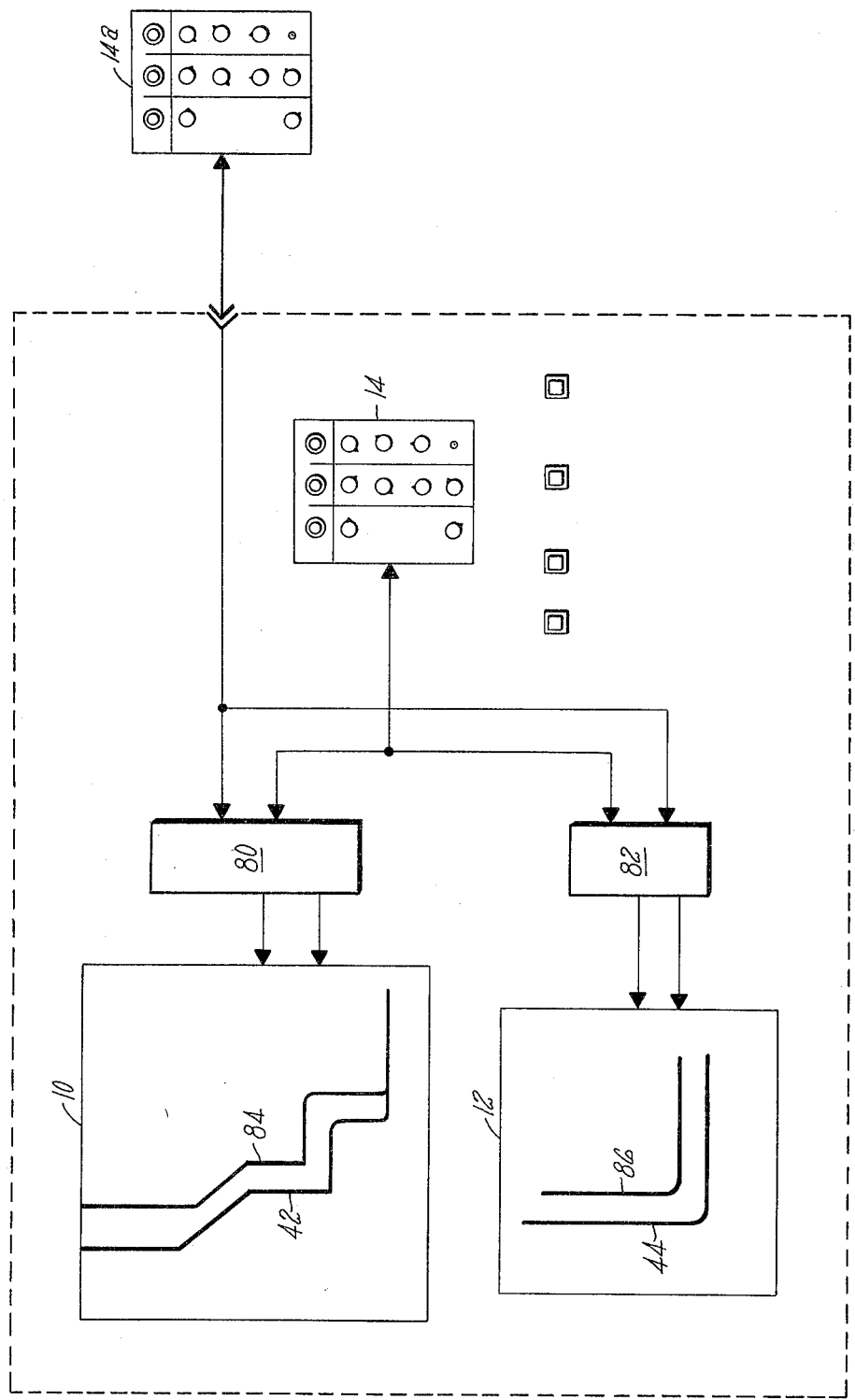
FIG. 5 is a front view of the demonstrator apparatus of FIG. 1 illustrating its utilization with an external simulated static trip unit programmer.

As an alternative to using the overlays of FIGS. 3 and 4, the demonstrator apparatus of the invention may be adapted to operate in conjunction with an external simulated static trip unit programmer 14a cabled thereto in the general fashion illustrated in FIG. 5. The two simulated programmers 14 and 14a separately communicate with driver 80 for display 10 and driver 82 for display 12 pursuant to generating curves 42 and 44 under the control of the demonstrator programmer and curves 84 and 86 under the control of the external programmer. The various controls of the two programmers may then be adjusted to demonstrate, as well as arrive at selective trip coordination of simulated upstream and downstream circuit breakers. To verify trip coordination, the demonstrator test pushbuttons are depressed to generate time traces of simulated overload, short circuit and ground fault current levels. The appropriate popout indicator of the simulated programmer whose curve is intersected first by the time trace, i.e., the downstream breaker curve, is activated, consistent with selective trip coordination. It should be pointed out that in the far instantaneous region, the curves coincide as illustrated in FIG. 5, and thus in practice either or both of the upstream and downstream breakers will trip. Consequently, reliable selective trip coordination in this region is not possible.

In the description thus far, the demonstrator apparatus is disclosed as including separate displays for overcurrent trip-time curves and ground fault trip-time curves. It will be appreciated however, the demonstrator may be provided with a single display which is switched between displaying the two types of trip-time curves.

Figure 6:
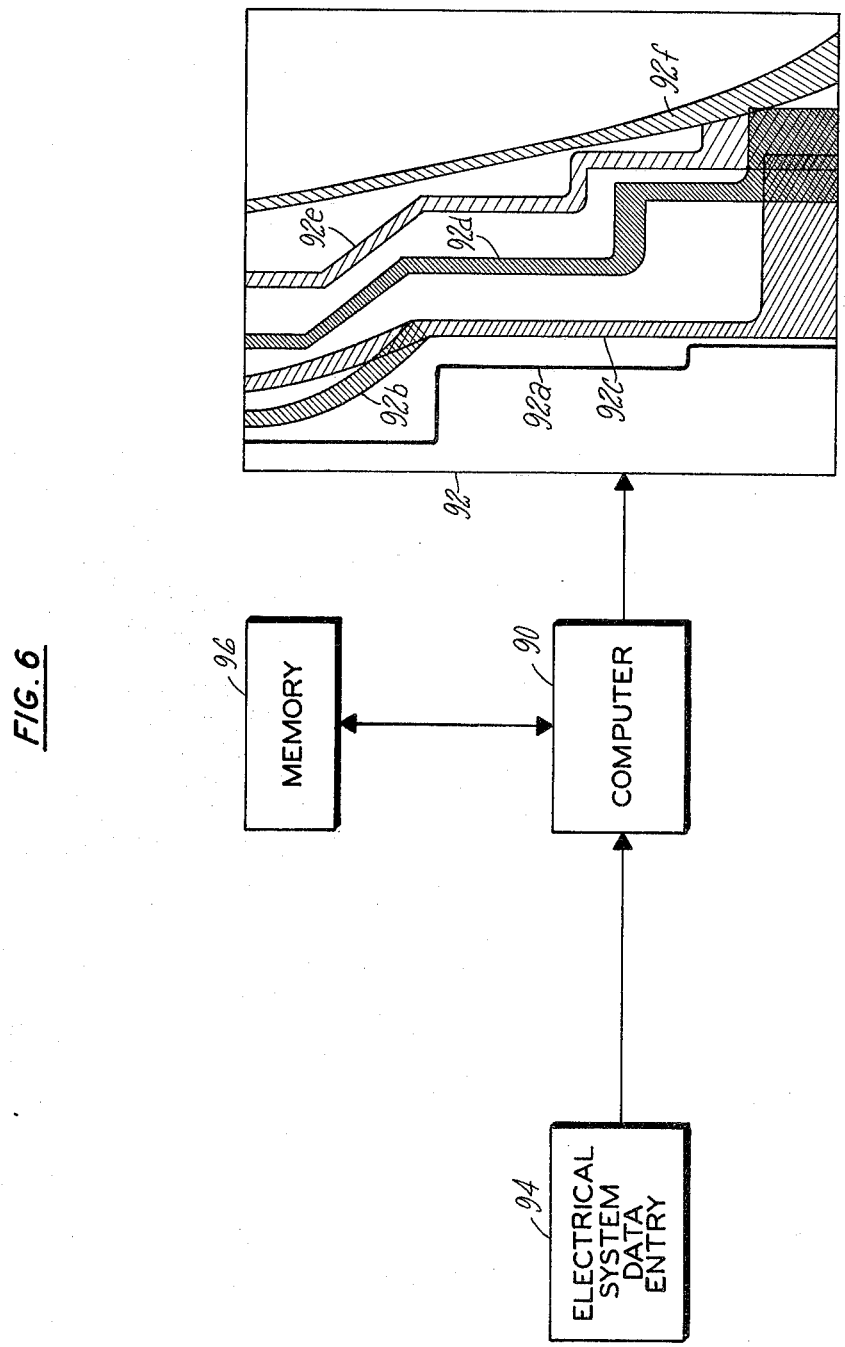
FIG. 6 is a block diagram of a system utilizing principles of the demonstrator apparatus of FIG. 1 in performing power distribution system protection and selective coordination studies.

As noted above, the demonstrator apparatus of FIGS. 1, 2, 4 and 5 has some utility in performing selective trip coordination studies. In FIG. 6 there is illustrated a system utilizing principles of the demonstrator apparatus in conjunction with a computer 90 to perform a complete selective coordination study on an electrical power distribution system. The computer communicates with a suitable display 92 either of the electronic type utilizable in the demonstrator apparatus or a commercially available X-Y plotter to develop a series of log-log coordinate time-current response curves for selected protective devices having the capability of affording selective trip coordination.

As with current practice, the first step in performing a coordination study utilizing the system of FIG. 6 is to diagram the distribution system to be coordinated. This diagram should include the buses, circuit breakers, relays and associated current transformers, power transformers, fuses, reactors, cabling and load equipment. Data pertaining to the appropriate impedance values of these components, their operating and protection rating boundaries (minimum protection requirements and withstand levels prescribed by the National Electric Code and American National Standard Institute), the chosen system voltages, frequency and current requirements, including full load current conditions, is entered into the computer via suitable data entry means 94. Using the component impedance values, the computer performs a short circuit study to determine the maximum and minimum short circuit currents available at all pertinent points in the distribution system. Computer programs to conduct such short circuit studies are well known. These impedance values also provide the basis for calculating the available ground fault currents at pertinent points in the system.

Computer 90 has access to a memory 96 in which is stored plotting data with which the computer can generate on display 92 the time-current response curves of the various types and kinds of available circuit protective devices, such as overload relays, circuit breakers, fuses, etc. From the data entered into the computer, a curve 92a is generated on display 92 representing for example, the normal operating current profile of a typical AC motor. The computer then determines the appropriately sized motor starter and the proper setting of its overload heater to amply protect the motor against abnormal overload currents and accesses memory 96 to obtain the plotting data for its time-current response curve which is then generated on display 92, as illustrated at 92b. Next, computer 90 selects the appropriate upstream circuit breaker which is capable of coordinating with the motor starter thermal overload unit and also protects the motor and its starter without tripping under the normal load current conditions represented by curve 92a. The plotting data for the selected upstream breaker is then retrieved from the memory and used to plot its trip-time curve 92c on display 92. Note that curve 92c rather closely conforms to but lies entirely to the right of current profile curve 92a, and thus the selected breaker affords maximum protection without nuisance tripping. If this upstream breaker has trip adjustment capabilities, the trip setting necessary to produce the displayed shape of curve 92c is indicated on display 92 or on a separate printout.

Again based on the system data entered into the computer, the next upstream circuit protective device is selected, for example a static trip circuit breaker, and the appropriate plotting data is retrieved from the memory to generate trip-time curve 92d on display. The trip unit programmer adjustment settings necessary to produce the requisite shape and position of curve 92d for selective trip coordination with the downstream breaker (curve 92c) are likewise indicated on the display or a separate printout. The computer then selects the next upstream protective device capable of coordinating with the previously selected protective device. Again, the candidate is assumed, for purposes of illustration, to be a static trip circuit breaker, and the plotting data therefor is accessed from the memory to generate trip-time curve 92e on display 92 in selective trip coordination with curve 92d. The programmer settings to achieve this coordination are likewise indicated.

Finally, the computer selects the appropriate ultimate upstream device and its time-current response curve, retrieved from memory 96, is generated on display 92, as indicated at 92f. This response curve is illustrated as being that of a current limiting power fuse and is seen to coordinate with the first downstream circuit breaker (curve 92e). Curves 92b through 92f generated on display 92 are illustrated as having defined widths corresponding to the response time tolerances of their associated circuit protective devices. That is, the curve widths indicate the minimum and maximum device response times for all levels of overcurrent.

From the foregoing description of FIG. 6, it is seen that a system is provided for performing system protection and coordination studies essentially automatically. Consequently, the tedious process of using a light box to facilitate manual tracing of protective device time-current response curves on transluscent log-log coordinate graph paper from response curves printed on underlying transluscent log-log coordinate graph paper in accordance with current practice is avoided.

It will thus be seen that the objects set forth above, among those made apparent in the preceding description, are efficiently attained and, since certain changes may be made in the above construction without departing from the scope of the invenion, it is intended that all matter contained in the above description or shown in the accompanying drawings shall be interpreted as illustrative and not in a limiting sense.

Having described our invention, what we claim as new and desire to secure by Letters Patent is:

1. Apparatus for displaying the time-current response characteristics of circuit protective devices, said apparatus comprising, in combination:
   A. a graphical display including a fixed vertical time coordinate in logarithmic scale and a fixed horizontal current coordinate in logarithmic scale;
   B. first variable means connected to said display for selectively electrically generating for portrayal on said display a first portion of a time-current response curve representing the long time response characteristics of a selected circuit protective device;

C. second variable means connected to said display for selectively electrically generating for portrayal on said display a second portion of said time-current response curve representing the short time response characteristics of the selected circuit protective device; and D. third variable means connected to said display for selectively electrically generating for portrayal on said display a third portion of said time-current response curve representing the instantaneous response characteristics of the selected circuit protective device, (1) said first, second and third curve portions as potrayed on said display providing a true and continuous graphical display in log-log coordinate scale of the selected circuit protective device's time-current response curve over the entire overcurrent range.

2. The apparatus defined in claim 1, wherein said first, second and third variable means are incorporated in a simulated programmer of a static trip unit for a circuit breaker, wherein the circuit breaker is the selected circuit protective device.

3. The apparatus defined in claim 2, wherein said first variable means includes a long time pickup adjustment and a long time delay adjustment, said second variable means includes a short time pickup adjustment and a short time delay adjustment, and said third variable means includes an instantaneous pickup adjustment.

4. The apparatus defined in claim 2, which further includes means for generating a time trace on said display at a predetermined level of overcurrent and means for detecting when said time trace intersects the displayed time-current response curve, said programmer further including an indicator activated by said detecting means to indicate the execution of a simulated overcurrent trip response function by the circuit breaker.

5. The apparatus defined in claim 2, which further includes a second graphical display including a fixed vertical time coordinate in logarithmic scale and a fixed horizontal current coordinate in logarithmic scale, and fourth variable means connected to said second display for selectively electrically generating for portrayal on said second display a time-current response curve in true log-log coordinate scale representing the response times of the circuit breaker static trip unit to a selected range of ground fault current levels.

6. The apparatus defined in claim 1, which further includes fourth means for displaying in proper graphical relationship with said time-current response curve portrayed on said display a second time-current response curve to another circuit protective device, thereby to portray selective response coordination of the two circuit protective devices.

7. The apparatus defined in claim 6, wherein said fourth means comprises a transparent overlay on which is printed in log-log coordinate scale the time-current response curve of the other circuit protective device, said overlay being superimposed on said display with the respective log-log coordinate scales in registration.

8. The apparatus defined in claim 6, wherein said first, second and third variable means are incorporated in a first simulated programmer of a static trip unit for a circuit breaker, wherein the circuit breaker is the selected circuit protective device, and said fourth means comprises a second simulated programmer of a static trip unit for another circuit breaker, said second programmer including corresponding first, second and third variable means connected to said display for selectively electrically generating for portrayal thereon a time-current response curve for the other circuit breaker, the first and second programmers generating their respective curves for joint portrayal on said display.

9. The apparatus defined in claim 6, wherein said first, second, third and fourth means are implemented in an electronic system including a computer electrically connected to said display for generating plural time-current response curves of selected circuit protective devices for portrayal on said display in accordance with plotting data selectively retrieved from a memory.

* * * * *